United States Patent
Xia et al.

(10) Patent No.: US 12,219,806 B2
(45) Date of Patent: Feb. 4, 2025

(54) DISPLAY PANEL AND METHOD OF MANUFACTURING THE SAME, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wei Xia, Beijing (CN); Tao Gao, Beijing (CN); Yanqiang Wang, Beijing (CN); Jie Li, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 410 days.

(21) Appl. No.: 17/379,017

(22) Filed: Jul. 19, 2021

(65) Prior Publication Data
US 2022/0140293 A1 May 5, 2022

(30) Foreign Application Priority Data
Oct. 30, 2020 (CN) .......................... 202011195221.0

(51) Int. Cl.
*H01L 51/52* (2006.01)
*H01L 27/32* (2006.01)
(Continued)

(52) U.S. Cl.
CPC ......... *H10K 50/865* (2023.02); *H10K 50/824* (2023.02); *H10K 59/122* (2023.02);
(Continued)

(58) Field of Classification Search
CPC .. H10K 50/865; H10K 50/824; H10K 59/122; H10K 59/35; H10K 59/38; H10K 50/856; H10K 59/878
See application file for complete search history.

(56) References Cited

U.S. PATENT DOCUMENTS 10,476,034 B2 * 11/2019 Im .......................... H10K 50/856
2014/0339521 A1 * 11/2014 Ozawa ................. H10K 50/844
438/46
(Continued)

FOREIGN PATENT DOCUMENTS

CN 109742260 A 5/2019
CN 110828695 2/2020
(Continued)

OTHER PUBLICATIONS

Chinese Office Action (w/ English translation) for corresponding Chinese Application No. 202011195221.0, dated May 12, 2020, 15 pages.
(Continued)

*Primary Examiner* — Vu A Vu
*Assistant Examiner* — Valerie N Newton
(74) *Attorney, Agent, or Firm* — Dority & Manning, P.A.

(57) ABSTRACT

A display panel includes a display substrate and a reflective layer. The display substrate includes light-emitting regions and a non-light-emitting region. The reflective layer is located on a light exit side of the display substrate and includes a plurality of filter portions and reflective portions arranged between every two adjacent filter portions. The reflective portions correspond to the non-light-emitting region, and the filter portions correspond to the light-emitting regions.

12 Claims, 6 Drawing Sheets

(51) Int. Cl.
  *H10K 50/824*   (2023.01)
  *H10K 50/86*    (2023.01)
  *H10K 59/122*   (2023.01)
  *H10K 59/35*    (2023.01)
  *H10K 71/00*    (2023.01)
  *H10K 59/12*    (2023.01)
  *H10K 59/38*    (2023.01)

(52) U.S. Cl.
  CPC ............. *H10K 59/35* (2023.02); *H10K 71/00* (2023.02); *H10K 59/1201* (2023.02); *H10K 59/38* (2023.02)

(56) References Cited

U.S. PATENT DOCUMENTS

| | | | | |
|---|---|---|---|---|
| 2016/0372528 | A1* | 12/2016 | Kamura | ............... H01L 31/055 |
| 2019/0212614 | A1* | 7/2019  | Kwak   | ............... G02F 1/133621 |
| 2019/0319082 | A1* | 10/2019 | Nam    | ............... H01L 23/5387 |
| 2021/0033761 | A1  | 2/2021  | Song et al. | |
| 2021/0202594 | A1* | 7/2021  | Jo     | ............... H10K 59/121 |
| 2021/0367187 | A1* | 11/2021 | Huang  | ............... H10K 50/856 |

FOREIGN PATENT DOCUMENTS

| | | |
|---|---|---|
| CN | 111769210 | 10/2020 |
| JP | 2008192314 | 8/2008 |

OTHER PUBLICATIONS

Chinese Office Action (w/ English translation) for corresponding Chinese Application No. 202011195221.0, dated May 12, 2022, 15 pages.

Chinese Office Action (w/ English translation) for corresponding CN Application No. 202011195221.0, dated Jun. 27, 2023, 20 pages.

* cited by examiner

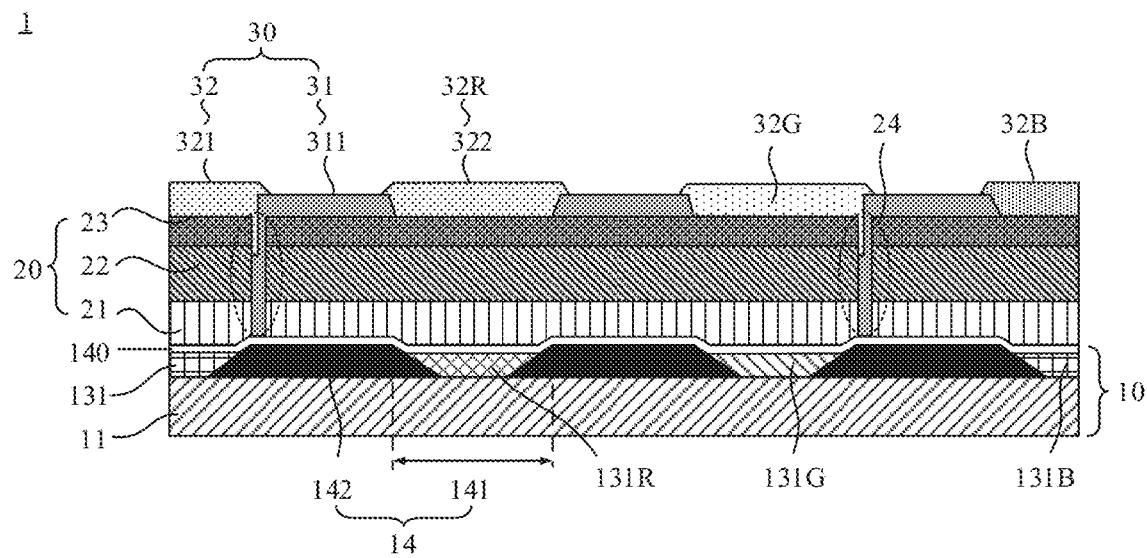

FIG. 6

| Fabricate a pixel circuit, an anode, a light-emitting layer, and a cathode on a side of a base sequentially to form a display substrate, and the display substrate includes light-emitting regions and a non-light-emitting region | ～ S100 |

↓

| Fabricate a reflective layer on a side of the cathode away from the light-emitting layer, and the reflective layer includes a plurality of filter portions and reflective portions arranged between every two adjacent filter portions; and the reflective portions correspond to the non-light-emitting region of the display substrate, and the filter portions correspond to the light-emitting regions of the display substrate | ～ S200 |

FIG. 7

DISPLAY PANEL AND METHOD OF MANUFACTURING THE SAME, AND DISPLAY APPARATUS

CROSS-REFERENCE TO RELATED APPLICATION

This application claims priority to Chinese Patent Application No. 202011195221.0, filed on Oct. 30, 2020, which is incorporated herein by reference in its entirety.

TECHNICAL FIELD

The present disclosure relates to the field of display technologies, and in particular, to a display panel and a method of manufacturing the same, and a display apparatus.

BACKGROUND

With the continuous development of intelligent technology, the market has more and more extensive requirements on products that combine mirror function and display function. Such products are not only applied to application scenes such as home, shopping malls, advertising, beauty and cosmetics, but also applied to scenes such as vehicle-mounted rear-view mirrors.

SUMMARY

In an aspect, a display panel is provided. The display panel includes a display substrate and a reflective layer. The display substrate includes light-emitting regions and a non-light-emitting region. The reflective layer is located on a light exit side of the display substrate, and includes a plurality of filter portions and reflective portions arranged between every two adjacent filter portions. The reflective portions correspond to the non-light-emitting region, and the filter portions correspond to the light-emitting regions.

In some embodiments, the display substrate further includes: a base and a plurality of sub pixels located on the base. The plurality of sub pixels are defined by a plurality of gate lines and a plurality of data lines that are crisscrossed, each sub pixel includes a light-emitting device and a pixel circuit electrically connected to the light-emitting device, and the light-emitting device includes an anode, a light-emitting layer, and a cathode that are stacked in sequence. The light-emitting regions include a region where the light-emitting device is located on the base, and the non-light-emitting region includes a region where the pixel circuit is located on the base.

In some embodiments, the display substrate further includes a pixel define layer, and the pixel define layer includes opening regions and retaining walls arranged around the opening regions. Positions of the opening regions correspond to positions of the light-emitting regions, positions of the retaining walls correspond to a position of the non-light-emitting region, and a material of the retaining walls is a black opaque material.

In some embodiments, the reflective portions are located on a side of the retaining walls away from the base, so that light emitted from one light-emitting region and directed to another adjacent light-emitting region is capable of being reflected by the reflective layer first and then being absorbed by the retaining walls.

In some embodiments, the display panel further includes an encapsulation layer located on a side of the cathode away from the light-emitting layer. The encapsulation layer includes a first inorganic encapsulation layer, an organic encapsulation layer and a second inorganic encapsulation layer that are sequentially stacked in a thickness direction of the display substrate and away from the display substrate. The reflective layer is located between the first inorganic encapsulation layer and the organic encapsulation layer. Or, the reflective layer is located on a side of the second inorganic encapsulation layer away from the display substrate.

In some embodiments, the encapsulation layer includes at least one via that is in one-to-one correspondence with at least one reflective portion. The at least one via penetrates the first inorganic encapsulation layer, and the at least one reflective portion is electrically connected to the cathode through a corresponding via. Or, the at least one via penetrates the first inorganic encapsulation layer, the organic encapsulation layer, and the second inorganic encapsulation layer, and the at least one reflective portion is electrically connected to the cathode through a corresponding via.

In some embodiments, a filter portion covers a via adjacent to the filter portion.

In some embodiments, an orthogonal projection of a reflective portion on the display substrate partially overlaps with an orthogonal projection of a filter portion adjacent to the reflective portion on the display substrate, so that the filter portion covers edges of the reflective portion adjacent to the filter portion.

In some embodiments, a thickness of the reflective portions is less than a thickness of the filter portions in a thickness direction of the display substrate.

In some embodiments, a plurality of light-emitting layers in the plurality of sub pixels include red light-emitting layers, green light-emitting layers, and blue light-emitting layers, and the plurality of filter portions include red filter portions, green filter portions, and blue filter portions. A position of a red filter portion corresponds to a position of a red light-emitting layer, and an area of an orthogonal projection of the red filter portion on the substrate is greater than an area of an orthogonal projection of the red light-emitting layer at a corresponding position on the substrate, A position of a green filter portion corresponds to a position of a green light-emitting layer, and an area of an orthogonal projection of the green filter portion on the substrate is greater than an area of an orthogonal projection of the green light-emitting layer at a corresponding position on the substrate. A position of a blue filter portion corresponds to a position of a blue light-emitting layer, and an area of an orthogonal projection of the blue filter portion on the substrate is greater than an area of an orthogonal projection of the blue light-emitting layer at a corresponding position on the substrate.

In some embodiments, a material of the reflective portions includes a metal material, and a material of the filter portions includes color photoresist.

In some embodiments, the material of the reflective portions includes aluminum, silver, gold, or copper.

In another aspect, a display apparatus is provided. The display apparatus includes the display panel as described above.

In yet another aspect, a method of manufacturing the display panel is provided. The manufacturing method includes: fabricating a pixel circuit, an anode, a light-emitting layer, and a cathode sequentially on a side of a base to form a display substrate, and the anode, the light-emitting layer and the cathode forming a light-emitting device; the display substrate including light-emitting regions and a non-light-emitting region, a light-emitting region including a region where the light-emitting device is located on the base, and the non-light-emitting region including a region where the pixel circuit is located on the base; and fabricating a reflective layer on a side of the cathode away from the light-emitting layer, the reflective layer including a plurality of filter portions and reflective portions arranged between every two adjacent filter portions, the reflective portions corresponding to the non-light-emitting regions, and the filter portions corresponding to the light-emitting region.

In some embodiments, fabricating the reflective layer on the side of the cathode away from the light-emitting layer includes: fabricating a first inorganic encapsulation layer on the cathode through a patterning process, and the first inorganic encapsulation layer including at least one via; fabricating a plurality of reflective portions on the first inorganic encapsulation layer through a patterning process, and at least one reflective portion being electrically connected to the cathode through a corresponding via; and fabricating the plurality of filter portions on the first inorganic encapsulation layer with the plurality of reflective portions through a patterning process.

In some embodiments, fabricating the first inorganic encapsulation layer on the cathode through the patterning process includes: depositing a layer of inorganic material film on the cathode; and fabricating at least one via penetrating the inorganic material film through a patterning process, and the at least one reflective portion being electrically connected to the cathode through a corresponding via.

In some embodiments, fabricating the plurality of reflective portions on the first inorganic encapsulation layer through the patterning process includes: evaporating a layer of metal material film on the first inorganic encapsulation layer; and forming a plurality of hollowed-out regions in regions of the metal material film corresponding to the light-emitting regions through a patterning process, positions of the plurality of hollowed-out regions corresponding to positions of the plurality of filter portions, and regions of the metal material film corresponding to the non-light-emitting region forming the plurality of reflective portions.

In some embodiments, after fabricating the reflective layer on the side of the cathode away from the light-emitting layer, the manufacturing method further includes: fabricating an organic encapsulation layer on the reflective layer; and fabricating a second inorganic encapsulation layer on the organic encapsulation layer.

In some embodiments, fabricating the reflective layer on the side of the cathode away from the light-emitting layer includes: fabricating an encapsulation layer on the cathode through a patterning process, the encapsulation layer including a first inorganic encapsulation layer, an organic encapsulation layer, and a second inorganic encapsulation layer that are sequentially fabricated on the cathode, and the encapsulation layer including at least one via; fabricating a plurality of reflective portions on the encapsulation layer through a patterning process, and at least one reflective portion being electrically connected to the cathode through a corresponding via; and fabricating the plurality of filter portions on the encapsulation layer with the plurality of reflective portions through a patterning process.

In some embodiments, fabricating the encapsulation layer on the cathode through the patterning process includes one of the following: depositing a layer of first inorganic material film on the cathode; fabricating at least one first via penetrating the first inorganic material film through a patterning process to form a first inorganic encapsulation layer; coating a layer of organic material film on the first inorganic encapsulation layer; fabricating at least one second via penetrating the organic material film through a patterning process to form an organic encapsulation layer, and a position of the at least one second via being in one-to-one correspondence with a position of the at least one first via; depositing a layer of the second inorganic material film on the organic encapsulation layer; fabricating at least one third via penetrating the second inorganic material film through a patterning process to form a second inorganic encapsulation layer, and a position of the at least one third via being in one-to-one correspondence with the position of the at least one second via; a first via, a corresponding second via and a corresponding third via together form a via; or, depositing a layer of first inorganic material film on the cathode; coating a layer of organic material film on the first inorganic material film; depositing a layer of second inorganic material film on the organic material film; and fabricating at least one via penetrating the first inorganic material film, and the organic material film and the second inorganic material film through a patterning process.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and actual timings of signals to which the embodiments of the present disclosure relate.

FIG. 6 is yet another structural diagram of a display panel, in accordance with some embodiments;

FIG. 7 is a flow diagram of a method of manufacturing a display panel, in accordance with some embodiments;

DETAILED DESCRIPTION

Figure 1A:
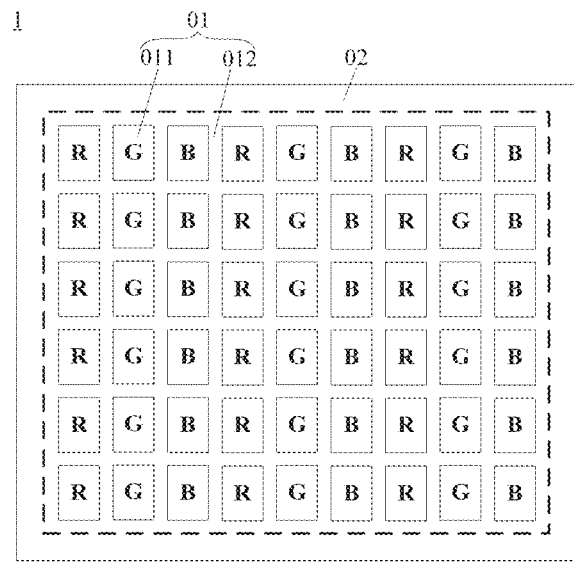
FIG. 1A is a plan view of a display panel, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to." In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are only used for descriptive purposes, and are not to be construed as indicating or implying the relative importance or implicitly indicating the number of indicated technical features. Thus, features defined as "first" and "second" may explicitly or implicitly include one or more of the features. In the description of the embodiments of the present disclosure, the term "a plurality of" means two or more unless otherwise specified.

In the description of some embodiments, the terms "coupled" and "connected" and their extensions may be used. For example, the term "connected" may be used in the description of some embodiments to indicate that two or more components are in direct physical contact or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The use of "applicable to" or "configured to" herein means an open and inclusive language, which does not exclude devices that are applicable to or configured to perform additional tasks or steps.

Exemplary embodiments are described herein with reference to sectional views and/or plan views as idealized exemplary drawings. In the accompanying drawings, thicknesses of layers and regions are enlarged for clarity. Therefore, variations in shape relative to the accompanying drawings due to, for example, manufacturing technologies and/or tolerances may be envisaged. Therefore, the exemplary embodiments should not be construed to be limited to shapes of regions shown herein, but to include deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Figure 1B:
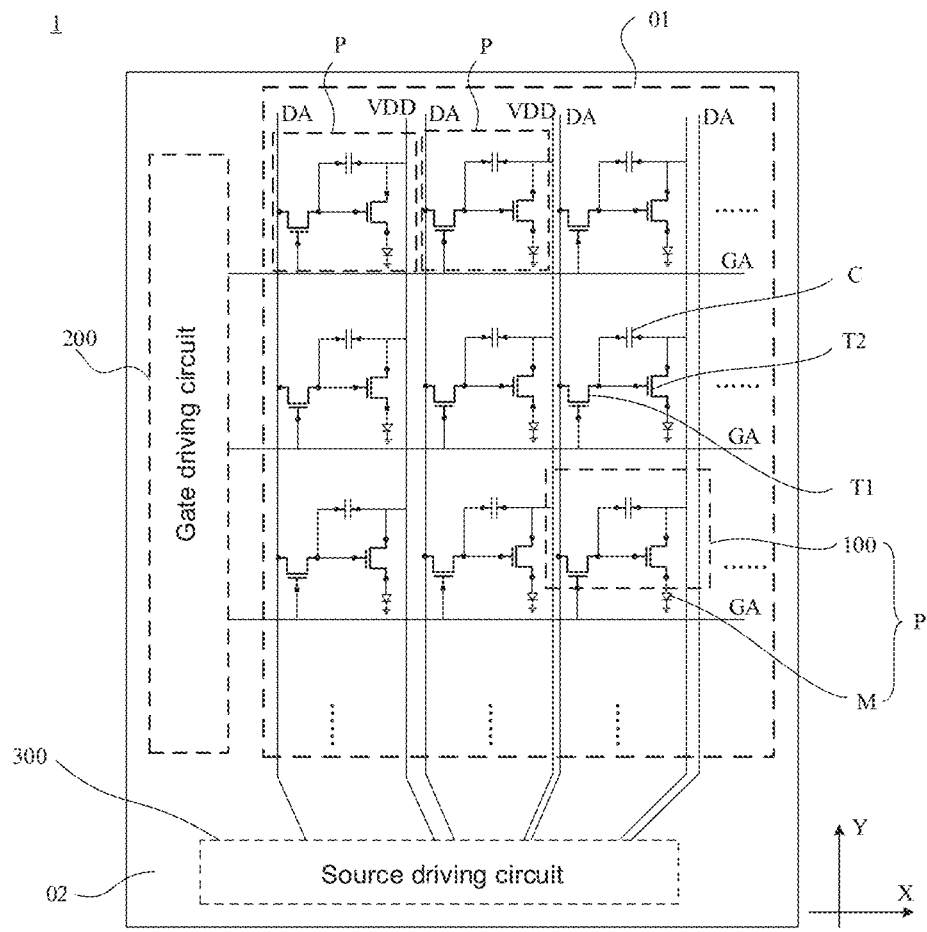
FIG. 1B is another plan view of a display panel, in accordance with some embodiments.
Figure 8:
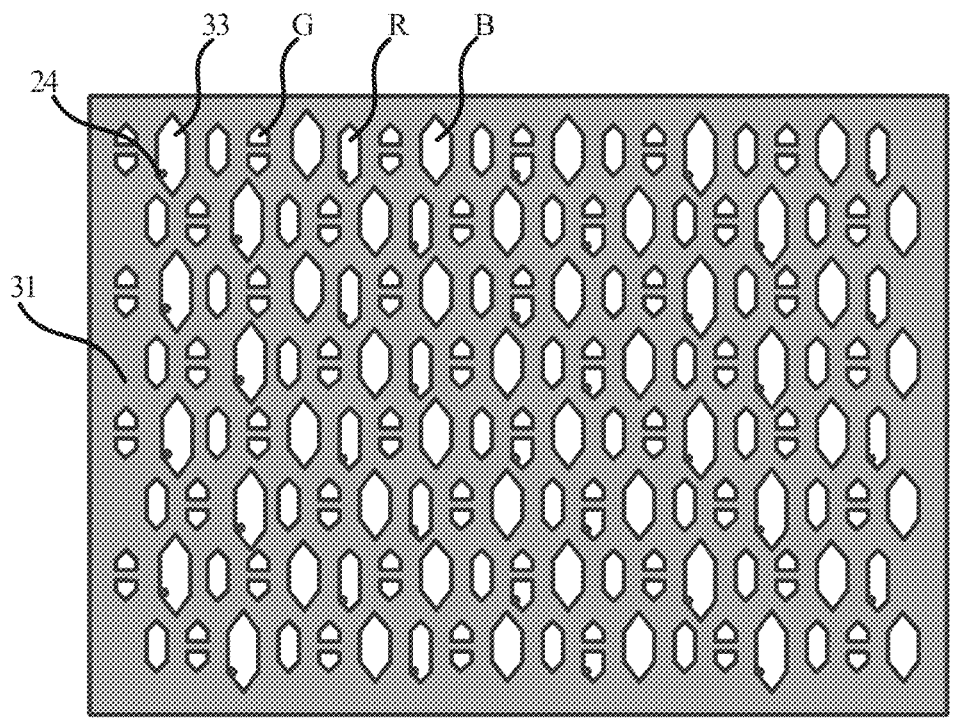
FIG. 8 is a plan view of a structure of a display panel without a filter portion, in accordance with some embodiments.
Figure 9:
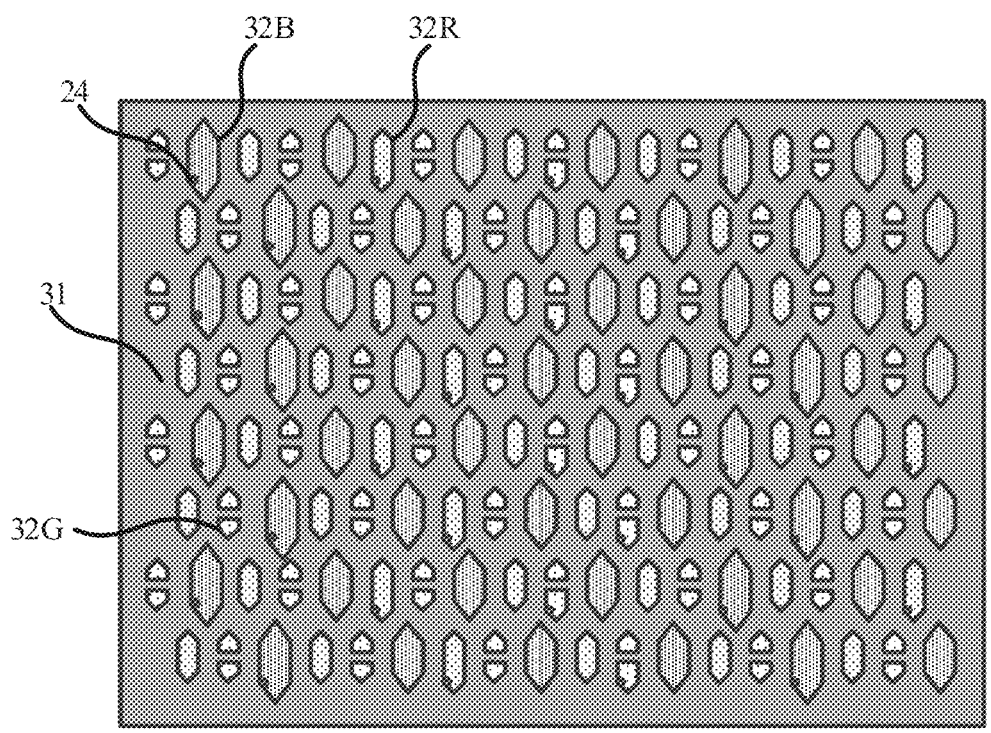
FIG. 9 is a plan view of a structure of a display panel with a filter portion, in accordance with some embodiments.

In some embodiments of the present disclosure, a display panel 1 is provided. As shown in FIGS. 1A and 1B, observing from a viewing angle directly facing a display surface of the display panel, the display panel 1 has an active area 01 and a peripheral area 02 located on at least one side of the active area 01. FIGS. 1A and 1B illustrate an example in which the peripheral area 02 surrounds the active area 01. As shown in FIG. 1A, the active area 01 includes a plurality of light-emitting regions 011 (each light-emitting region 011 corresponding to one sub pixel) and a non-light-emitting region 012. The plurality of light-emitting regions 011 include red light-emitting regions for emitting red light, blue light-emitting regions for emitting blue light, and green light-emitting regions for emitting green light. In some embodiments, as shown in FIG. 1A, a column of red light-emitting regions R, a column of green light-emitting regions G, and a column of blue light-emitting regions B are alternately arranged in sequence. In some other embodiments, as shown in FIGS. 8 and 9, the arrangement sequence of the red light-emitting regions R, the green light-emitting regions G, and the blue light-emitting regions B may be changed. The peripheral area 02 is used for wiring, so that the plurality of sub pixels in the active area 01 are connected to a gate driving circuit or a source driving circuit through the wires.

As shown in FIG. 1B, the active area 01 has a plurality of sub pixels P defined by gate lines GA and data lines DA. In consideration of convenience, the following description is made by taking an example in which the plurality of sub pixels P are arranged in a matrix form, and sub pixels P arranged in a row in a horizontal direction X are referred to as sub pixels in a same row, and sub pixels P arranged in a column in a vertical direction Y are referred to as sub pixels in a same column. Each sub pixel P includes a pixel circuit 100 and a light-emitting device M electrically connected to the pixel circuit 100. The pixel circuit 100 is capable of driving the light-emitting device M electrically connected thereto to emit light. The plurality of light-emitting regions 011 are formed in a region in which the light-emitting device M is located, and the non-light-emitting region 012 is formed in a region in which the pixel circuit 100 is located.

As shown in FIG. 1B, the display panel 1 includes a gate driving circuit 200 and a source driving circuit 300 located in the peripheral area 02. FIG. 1B illustrates an example in which the gate driving circuit 200 is located on the left side of the active area 01 and the source driving circuit 300 is located on the lower side of the active area 01. The gate driving circuit 200 is configured to provide the gate lines GA with gate driving signals row by row. The source driving circuit 300 is configured to provide data signals to the data lines DA and voltage signals to voltage signal lines VDD. In this way, the pixel circuit 100 drives the light-emitting device M electrically connected thereto to emit light under the joint action of the gate driving signal, the data signal and the voltage signal.

The display panel 1 may be an organic light-emitting diode display (OLED) display panel or a quantum dot light-emitting diodes (OLED) display panel.

Figure 2A:
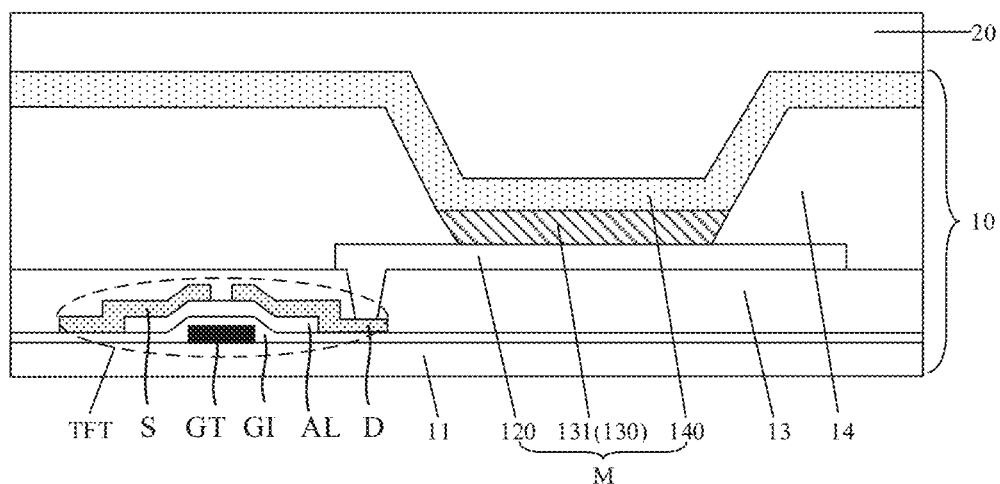
FIG. 2A is a structural diagram of a display panel, in accordance with some embodiments.
Figure 2B:
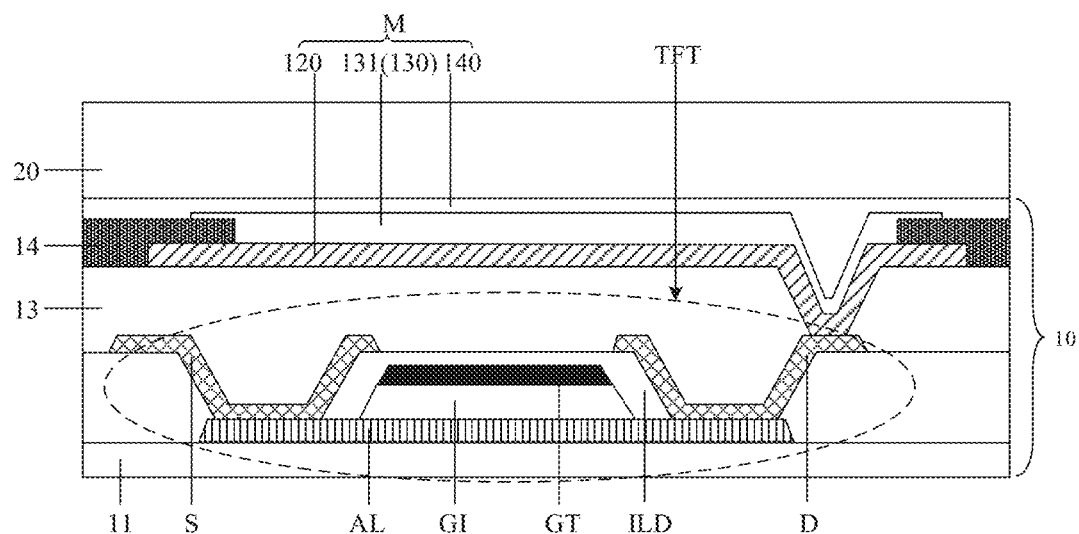
FIG. 2B is another structural diagram of a display panel, in accordance with some embodiments.

As shown in FIGS. 2A and 2B, the display panel 1 includes a display substrate 10, and the display substrate 10 includes a base 11. The gate lines GA, the data lines DA, the voltage signal lines VDD, the pixel circuits 100, the light-emitting devices M, and the gate driving circuit 200 are all arranged on the base 11. The source driving circuit 300 may be disposed on the base 11 or on a flexible printed circuit (FPC) electrically connected to the base 11. The base 11 may be a polyimide flexible base or a rigid base such as glass.

The gate lines GA and the data lines DA are insulated and crossed, and the voltage signal lines VDD may be parallel to the data lines DA.

As shown in FIGS. 1B, 2A, and 2B, the pixel circuit 100 includes a plurality of thin film transistors TFT and at least one capacitor C. The thin film transistor TFT may be of a top-gate or a bottom-gate structure. As shown in FIG. 2A, in a case where the thin film transistor TFT is of the bottom-gate structure, it includes a gate GT, a gate insulating layer GI, an active layer AL, a source-drain electrode (including a source S and a drain D) that are sequentially stacked on the base 11. As shown in FIG. 2B, in a case where the thin film transistor TFT is of the top-gate structure, it includes an active layer AL, a gate insulating layer GI, a gate GT, an interlayer dielectric layer ILD, a source-drain electrode (including a source S and a drain D) that are sequentially stacked on the base 11.

The active layer AL of the thin film transistor TFT may be made of amorphous silicon, single crystal silicon, polycrystalline silicon, or an oxide semiconductor. The active layer AL includes a channel region that is not doped with impurities, and a source region and a drain region formed by doping impurities on both sides of the channel region. The doped impurities vary with the types of the thin film transistors, and may be an N-type impurity or a P-type impurity.

The capacitor C includes a first electrode plate and a second electrode plate, and an interlayer insulating film as a dielectric is provided between the two electrode plates.

As shown in FIG. 1B, the electrical connection relationships inside and outside the pixel circuit 100 are illustrated by taking an example in which the pixel circuit 100 includes two thin film transistors TFT (i.e., a switching thin film transistor T1 and a driving thin film transistor T2) and one capacitor C (i.e., 2T1C). FIGS. 2A and 2B only illustrate structures and a connection relationship of the driving thin film transistor (i.e., the structure in the dashed circle) and the light-emitting device M.

Figure 2C:
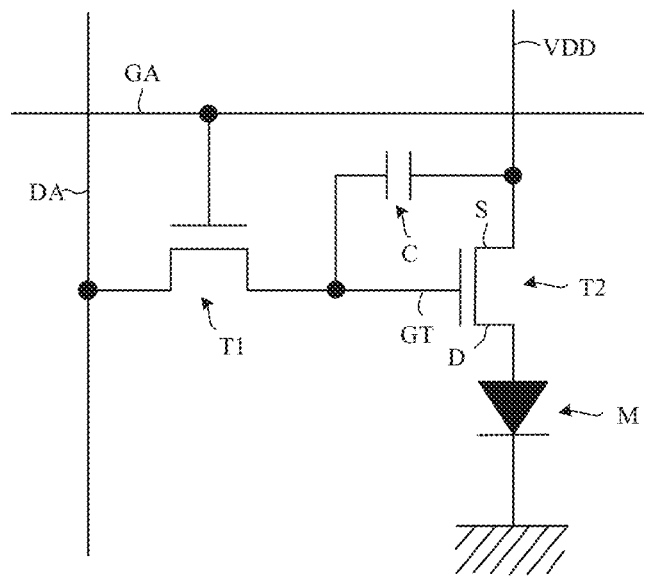
FIG. 2C is an equivalent circuit diagram of a pixel circuit and a light-emitting device, in accordance with some embodiments.

As shown in FIG. 2C, a gate of the switching thin film transistor T1 is connected to the gate line GA, a source of the switching thin film transistor T1 is connected to the data line DA, and a drain of the switching thin film transistor T1 is connected to the gate GT of the driving thin film transistor T2. The source S of the driving thin film transistor T2 is connected to the voltage signal line VDD, and the drain D of the driving thin film transistor T2 is connected to an anode 120 of the light-emitting device M through a via. A first electrode plate of the capacitor C is connected to the gate GT of the driving thin film transistor T2, and a second electrode plate of the capacitor C is connected to the source S of the driving thin film transistor T2.

The switching thin film transistor T1 is turned on through a gate voltage applied to the gate line GA, thereby transmitting a data voltage applied to the data line DA to the driving thin film transistor T2. There is a difference between the data voltage transmitted from the switching thin film transistor T1 to the driving thin film transistor T2 and a common voltage applied from the voltage signal line VDD to the driving thin film transistor T2. A voltage corresponding to an absolute value of the difference is stored in the capacitor C, and a current corresponding to the voltage stored in the capacitor C flows into the light-emitting device M through the driving thin film transistor T2 and causes the light-emitting device M to emit light.

A light-emitting device M includes an anode 120, a light-emitting functional layer 130, and a cathode 140. The anode 120 and the cathode 140 respectively inject holes and electrons into the light-emitting functional layer 130, and when excitons generated by the combination of the holes and the electrons transition from an excited state to a ground state, light is generated.

The anode 120 may be formed of a metal with high reflectivity, and the cathode 140 may be formed of a transparent conductive film. In this case, light of the light-emitting functional layer 130 is reflected by the anode 120 and exits to the outside through the cathode 140, thereby forming a top-emission-type light-emitting device. However, it is not limited to this. In a case where the anode 120 is formed of a transparent conductive film and the cathode 140 is formed of a metal with high reflectivity, a bottom-emission-type light-emitting device may be formed. Of course, in a case where both the anode 120 and the cathode 140 are formed of a transparent conductive film, a double-sided emission light-emitting device may be formed.

A material of the transparent conductive film may be, for example, indium tin oxide (ITO), indium zinc oxide (IZO), or indium gallium zinc oxide (IGZO). The metal with high reflectivity may be, for example, Ag.

In some embodiments, the light-emitting functional layer 130 includes a light-emitting layer 131. In some other embodiments, in addition to the light-emitting layer 131, the light-emitting functional layer 130 further includes one or more layers of a hole injection layer (HIL), a hole transport layer (HTL), an electron transport layer (ETL) and an electron injection layer (EIL).

A plurality of light-emitting layers 131 may include red light-emitting layers 131R emitting red light, green light-emitting layers 131G emitting green light, and blue light-emitting layers 131B emitting blue light. The red light-emitting layer 131R, the green light-emitting layer 131G, and the blue light-emitting layer 131B respectively form a red sub pixel, a green sub pixel, and a blue sub pixel, thereby forming a color image. It will be understood that, the red light-emitting layer 131R corresponds to the red light-emitting region R, the green light-emitting layer 131G corresponds to the green light-emitting region G, and the blue light-emitting layer 131B corresponds to the blue light-emitting region B.

Figure 3:
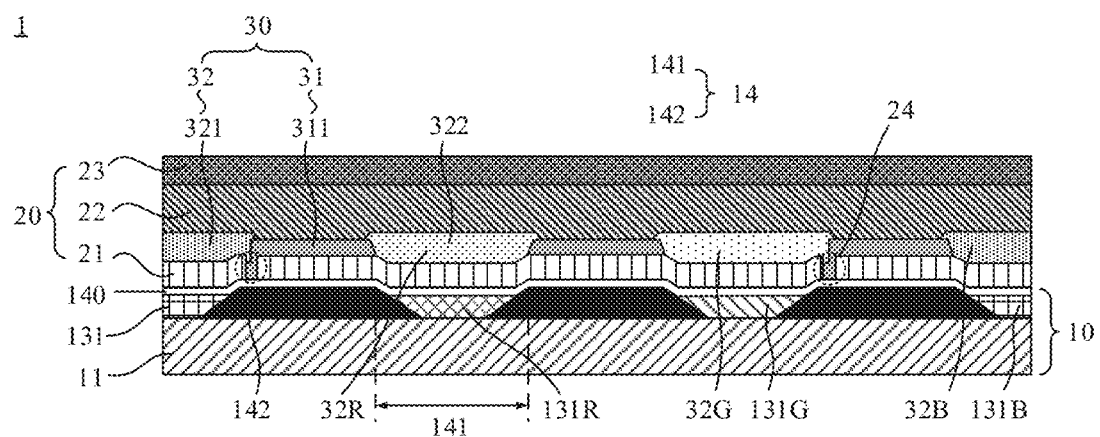
FIG. 3 is yet another structural diagram of a display panel, in accordance with some embodiments.

As shown in FIGS. 2A and 2B, the display substrate 10 further includes a planarization layer 13 disposed between the thin film transistor TFT and the anode 120, and a pixel define layer 14 disposed on a side of the anode 120 away from the base 11. As shown in FIG. 3, the pixel define layer 14 includes a plurality of opening regions 141 and retaining walls 142 arranged around the opening regions 141. One light-emitting device M is arranged in one opening region 141, the anodes 120 and the light-emitting layers 131 of adjacent light-emitting devices M are separated by the retaining walls 142 of the pixel define layer 14, and the cathodes 140 of the light-emitting devices M are connected as a whole, that is, the cathode 140 is an entire layer. It will be understood that, a position of the opening regions 141 corresponds to a position of the light-emitting regions 011, and a position of the retaining walls 142 corresponds to a position of the non-light-emitting region 012.

In a case where the light-emitting device M includes one or more layers of the hole injection layer, the hole transport layer, the electron transport layer and the electron injection layer, as for one layer among them, every this layer corresponding to each light-emitting device M may be connected as a whole, that is, an entire layer; or, every this layer corresponding to each light-emitting device M may be disconnected, that is, which only disposed in the opening regions 141.

In some embodiments, as shown in FIGS. 2A and 2B, the display panel 1 further includes an encapsulation layer 20 for encapsulating the display substrate 10. The encapsulation layer 20 may be an encapsulation film or an encapsulation substrate.

In a case where the encapsulation layer 20 is an encapsulation film, the number of layers of the encapsulation film included in the encapsulation layer 20 is not limited. In some embodiments, the encapsulation layer 20 may include one layer of encapsulation film, or may include two or more layers of encapsulation films that are stacked. For example, the encapsulation layer 20 includes three layers of encapsulation films that are stacked in sequence.

In a case where the encapsulation layer 20 includes three layers of encapsulation films that are stacked in sequence, a material of an encapsulation film located in the middle layer is an organic material, and materials of encapsulation films located on both sides are an inorganic material.

Herein, the organic material is not limited, and the organic material may be, for example, polymethyl methacrylate (PMMA). Similarly, the inorganic material is not limited, and the inorganic material may be one or more of silicon nitride ($SiN_x$), silicon oxide ($SiO_x$), or silicon oxynitride ($SiO_xN_y$).

Figure 4:
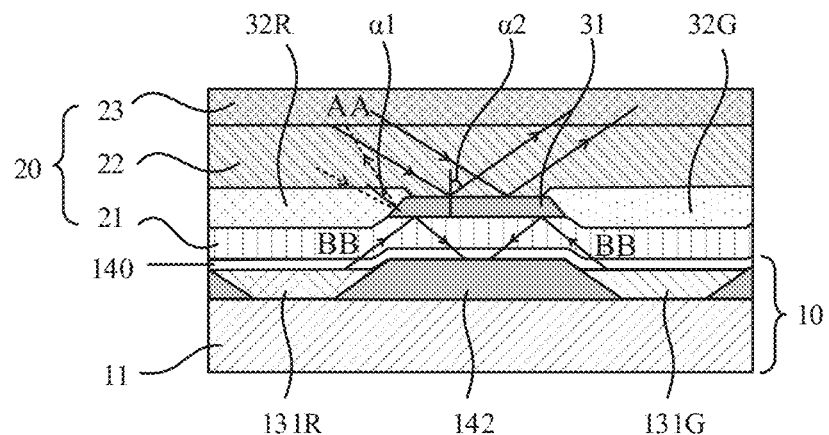
FIG. 4 is a schematic diagram showing light propagating in the display panel shown in FIG. 3.

As shown in FIGS. 3 and 4, the display panel 1 provided by some embodiments of the present disclosure not only includes the display substrate 10, but also includes a reflective layer 30 arranged on a light exit side of the display substrate 10. The reflective layer 30 includes a plurality of filter portions 32 and reflective portions 31 arranged between every two adjacent filter portions 32. The reflective portions 31 correspond to the non-light-emitting region 012 of the display substrate 10, and the filter portions 32 correspond to the light-emitting regions 011 of the display substrate 10.

In order to show the structure of the reflective layer 30 more clearly, the structures such as the thin film transistor TFT, the planarization layer 13, and the anode 120 on the base 11 are omitted in FIG. 3, and these structures may be referred to FIGS. 2A and 2B.

The display panel 1 provided by some embodiments of the present disclosure includes the reflective layer 30, and the reflective layer 30 includes the plurality of filter portions 32 and the reflective portions 31 arranged between every two adjacent filter portions 32. The reflective portions 31 correspond to the non-light-emitting region 012 of the display substrate 10, and the filter portions 32 correspond to the light-emitting regions 011 of the display substrate 10; the reflective portions 31 are capable of reflecting external ambient light, so that the display panel 1 can achieve function of a mirror display. The existence of the filter portions 32 may reduce the reflection of the external ambient light in the active area 01, increase the contrast of the display panel 1, and improve its display quality. That is, the display panel 1 of some embodiments of the present disclosure integrates the filter portions 32 and the reflective portions 31, which improves the quality of mirror display. In addition, the filter portions 32 and the reflective portions 31 are disposed in a same layer, which further reduces a thickness of the display panel 1 and the manufacturing steps, reduces the manufacturing cost, and improves market competitiveness while improving the display quality.

In some embodiments, a material of the reflective portions 31 is a metal material. The reflective portions 31 cause the amplitude of the light entering the reflective portions 31 to be rapidly attenuated by utilizing the characteristic of the metal having a large extinction coefficient, which further causes the light energy entering the reflective portions 31 to be correspondingly reduced, and increases the light energy reflected by the reflective portions 31. The greater the extinction coefficient of the metal is, the faster the amplitude of light decays, and the less light energy enters the metal, the higher the reflectivity of the metal is. Therefore, the reflective portions 31 generally select the metal with a large extinction coefficient and relatively stable optical properties as a manufacturing material, such as aluminum, silver, gold and copper.

In some embodiments, as shown in FIG. 3, a material of the retaining walls 142 included in the pixel define layer 14 is a black opaque material. In some embodiments, the black opaque material is a black photosensitive polyimide material, and its main components include photosensitive polyimide and melanin. A reflectivity of the black opaque material to visible light may be reduced to about 5%. In this way, in a case where the material of the retaining walls 142 is the black opaque material, the retaining walls can work together with the reflective portions 31 to avoid a color mixing phenomenon among the sub pixels.

As shown in FIG. 4, when ambient light AA coming from the outside is irradiated to the display panel 1, a reflective portion 31 is capable of reflecting the ambient light AA out of the display panel 1 to realize the function of mirror display well. In addition, when the display panel 1 displays images, light BB emitted by two adjacent light-emitting layers 131 (e.g., a red light-emitting layer 131R and a green light-emitting layer 131G) may be incident on a retaining wall 142 after being reflected by the reflective portion 31. Since the material of the retaining wall 142 is the black opaque material, light incident on the retaining wall 142 may be absorbed by the retaining wall 142, so that a problem of light mixing will not occur among adjacent sub pixels. Therefore, the reflective portion 31 and the black retaining wall 142 work together to avoid the color mixing phenomenon among the sub pixels.

Figure 5:
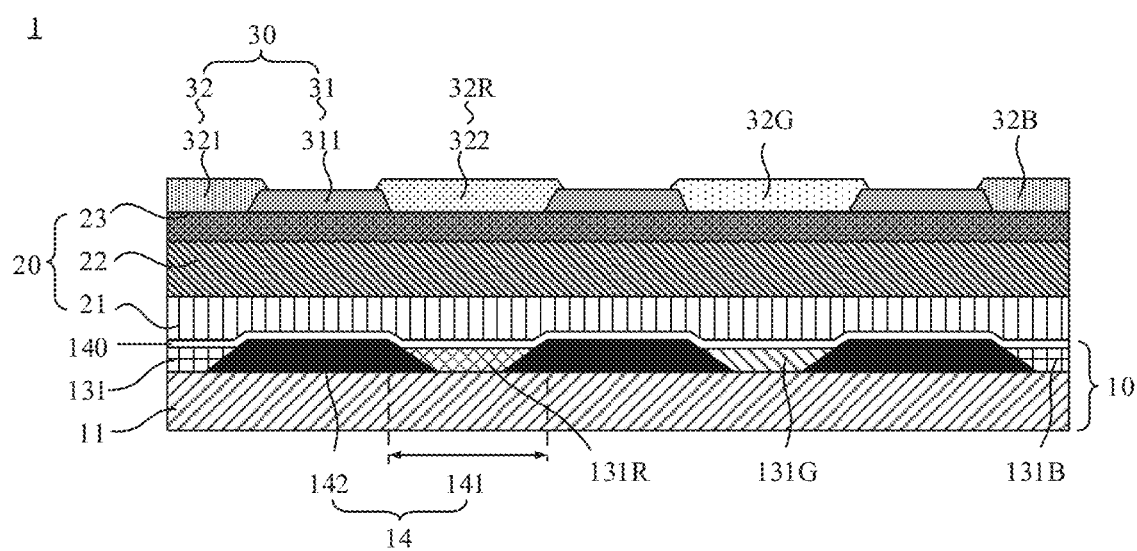
FIG. 5 is yet another structural diagram of a display panel, in accordance with some embodiments.

As described above, in some embodiments, the display panel 1 includes the encapsulation layer 20. For example, as shown in FIGS. 3 and 5, the encapsulation layer 20 includes a first inorganic encapsulation layer 21, an organic encapsulation layer 22 and a second inorganic encapsulation layer 23. In some embodiments, as shown in FIG. 5, the encapsulation layer 20 is disposed between the display substrate 10 and the reflective layer 30. That is, the reflective layer 30 is located on a side of the second inorganic encapsulation layer 23 away from the display substrate 10.

In some other embodiments, as shown in FIG. 3, the encapsulation layer 20 is disposed on the display substrate 10, and the reflective layer 30 is located within the encapsulation layer 20. For example, the reflective layer 30 is located between the first inorganic encapsulation layer 21 and the organic encapsulation layer 22. In this case, since the second inorganic encapsulation layer 23 is provided on a side of the reflective layer 30 away from the display substrate 10, there is no need to separately fabricate a protective film layer on the reflective layer 30, so that the thickness of the display panel 1 can be reduced.

For the top-emission-type light-emitting device, in order to ensure a light outgoing efficiency of the light-emitting device M, the cathode 140 needs to be a semipermeable membrane. In order to improve a transparency of the metal material of the cathode, a thickness of the cathode 140 must be reduced, and the thickness of the cathode 140 is usually several tens of nanometers. However, thinning the cathode 140 will greatly increase the resistance of the cathode 140. For a panel with a large size, a cathode 140 with a high resistance will increase the voltage drop (IR Drop), so that the screen display has an uneven brightness, and the display quality is reduced. At present, an auxiliary cathode is usually used to reduce the resistance of the cathode, thereby reducing the IR Drop. However, the setting of the auxiliary cathode will add a mask process, which correspondingly increases the production cost.

Based on the problem existing in the current auxiliary cathode, in some embodiments of the present disclosure, the following solution that the reflective portions 31 of the reflective layer 30 is used as the auxiliary cathode may be adopted. In some embodiments, as shown in FIG. 3, the encapsulation layer 20 includes at least one via 24 that is in one-to-one correspondence with at least one reflective portion 31. The via 24 penetrates the first inorganic encapsulation layer 21, and the at least one reflective portion 31 is electrically connected to the cathode 140 through a corresponding via 24.

In some other embodiments, as shown in FIG. 6, the encapsulation layer 20 includes at least one via 24 that is in one-to-one correspondence with the at least one reflective portion 31, and the via 24 penetrates the first inorganic encapsulation layer 21, the organic encapsulation layer 22 and the second inorganic encapsulation layer 23. The at least one reflective portion 31 is electrically connected to the cathode 140 through the corresponding via 24. In some embodiments of the present disclosure, the reflective portions 31 of the reflective layer 30 are used as the auxiliary cathode, which can reduce a mask process and can reduce the production cost.

Moreover, in a case where the reflective layer 30 is located between the first inorganic encapsulation layer 21 and the organic encapsulation layer 22, that is, the reflective layer 30 is located within the encapsulation layer 20, the via 24 only needs to penetrate the first inorganic encapsulation layer 21, which reduces the complexity and difficulty of the process.

In some embodiments, an orthogonal projection of a reflective portion 31 on the display substrate 10 partially overlaps with orthogonal projections of filter portions 32 adjacent thereto on the display substrate 10, so that sides of the reflective portion 31 are embedded by the filter portions 32 adjacent thereto, which reduces the scattering caused by the sides of the reflective portion 31. For example, as shown in FIGS. 3 and 5, the reflective portion 31 and the filter portions 32 are numbered sequentially from left to right, the leftmost reflective portion 31 is a first reflective portion 311, and two filter portions 32 adjacent to the first reflective portion 311 are a first filter portion 321 and a second filter portion 322. An orthogonal projection of the first reflective portion 311 on the display substrate 10 partially overlaps with orthogonal projections of the first filter portion 321 and the second filter portion 322 on the display substrate 10. That is, the first filter portion 321 and the second filter portion 322 overlap the first reflective portion 311, and embed the sides of the first reflective portion 311.

As shown in FIG. 4, when a beam of parallel light is irradiated on a reflective portion 31 (e.g., the first reflective portion 311), since the sides of the reflective portion 31 are inclined, and an angle α1 of reflected light of the beam of parallel light that is reflected by the sides is different from an angle α2 of the reflected light reflected by a plane, a degree of scattering of the reflected light will be increased. Therefore, in some embodiments, the filter portion 32 covers the sides of the reflective portion 31, which can reduce the scattering caused by the sides of the reflective portion 31.

In some embodiments, as shown in FIGS. 3 and 5, in a direction perpendicular to the display substrate 10, a thickness of the reflective portion 31 is less than a thickness of the filter portion 32, so that the filter portion 32 can cover the sides of the reflective portion 31.

In some embodiments, an orthogonal projection of a filter portion 32 on the display substrate 10 covers an orthogonal projection of a via 24 adjacent thereto on the display substrate 10. That is, the filter portion 32 embeds the via 24 adjacent thereto, which can reduce the scattering caused at the via 24. For example, as shown in FIGS. 3 and 6, an orthogonal projection of the first filter portion 321 on the display substrate 10 covers an orthogonal projection of a via 24 adjacent thereto on the display substrate 10, and the first filter portion 321 fills a portion of the via 24 that is not filled by the first reflective portion 311, and embeds the via 24.

In some embodiments, as shown in FIGS. 3 and 5, an area of the orthogonal projection of the filter portion 32 on the display substrate 10 is greater than an area of an orthogonal projection of a corresponding light-emitting layer 131 on the display substrate 10, which can ensure that the filter portion 32 effectively covers the light-emitting layer 131.

For example, in some embodiments of the present disclosure, the plurality of light-emitting layers 131 include the red light-emitting layers 131R, the green light-emitting layers 131G, and the blue light-emitting layers 131B. Of course, in actual design, the plurality of light-emitting layers 131 may also include light-emitting layers of other colors, such as white light-emitting layers. The plurality of filter portions 32 include red filter portions 32R, green filter portions 32G, and blue filter portions 32B. A position of the red filter portion 32R corresponds to a position of the red light-emitting layer 131R, and an area of an orthogonal projection of the red filter portion 32R on the display substrate 10 is greater than an area of an orthogonal projection of a corresponding red light-emitting layer 131R on the display substrate 10. A position of the green filter portion 32G corresponds to a position of the green light-emitting layer 131G, and an area of an orthogonal projection of the green filter portion 32G on the display substrate 10 is greater than an area of an orthogonal projection of a corresponding green light-emitting layer 131G on the display substrate 10. A position of the blue filter portion 32B corresponds to a position of the blue light-emitting layer 131B, and an area of an orthogonal projection of the blue filter portion 32B on the display substrate 10 is greater than an area of an orthogonal projection of a corresponding blue light-emitting layer 131B on the display substrate 10.

It will be noted that, in some embodiments of the present disclosure, the position of the red filter portion 32R corresponds to the position of the red light-emitting layer 131R, which means that, for example, the red filter portion 32R is located directly above the red light-emitting layer 131R; the position of the green filter portion 32G corresponds to the position of the green light-emitting layer 131G, which means that, for example, the green filter portion 32G is located directly above the green light-emitting layer 131G; and the position of the blue filter portion 32B corresponds to the position of the blue light-emitting layer 131B, which means that, for example, the blue filter portion 32B is located directly above the blue light-emitting layer 131B.

In a case where the plurality of filter portions 32 include the red filter portions 32R, the green filter portions 32G, and the blue filter portions 32B, since materials for fabricating the red filter portion 32R, the green filter portion 32G, and the blue filter portion 32B have a leveling property, the filter portion 32 covering the sides of the reflective portion 31 may be that, for example: the red filter portion 32R covers sides of reflective portions 31 adjacent to the red filter portion 32R, the green filter portion 32G covers sides of reflective portions 31 adjacent to the green filter portion 32G, and the blue filter portion 32B covers sides of reflective portions 31 adjacent to the blue filter portion 32B.

In addition, in the case where the plurality of filter portions 32 include the red filter portions 32R, the green filter portions 32G, and the blue filter portions 32B, since materials for fabricating the red filter portion 32R, the green filter portion 32G, and the blue filter portion 32B have the leveling property, the filter portion 32 embeds the via 24 may be that, for example: the red filter portion 32R embeds a via 24 adjacent to the red filter portion 32R that is not filled with the material of the reflective portion 31, the green filter portion 32G embeds a via 24 adjacent to the green filter portion 32G that is not filled with the material of the reflective portion 31, and the blue filter portion 32B embeds a via 24 adjacent to the blue filter portion 32B that is not filled with the material of the reflective portion 31.

In some embodiments of the present disclosure, a display apparatus is further provided, including the display panel 1. Since the display apparatus includes the display panel 1, the display apparatus has the same beneficial effects as the display panel 1. Therefore, the beneficial effects of the display apparatus will not be repeated.

In some embodiments of the present disclosure, a method of manufacturing the display panel 1 is further provided. As shown in FIG. 7, the method includes S100 to S200.

In S100, a pixel circuit 100, an anode 120, a light-emitting layer 131, and a cathode 140 are sequentially fabricated on a side of a base 11 to form a display substrate 10, and the display substrate 10 includes light-emitting regions 011 and a non-light-emitting region 012.

In S200, a reflective layer 30 is fabricated on a side of the cathode 140 away from the light-emitting layer 131, and the reflective layer 30 includes a plurality of filter portions 32 and reflective portions 31 arranged between every two adjacent filter portions 32; and the reflective portions 31 correspond to the non-light-emitting region 012 of the display substrate 10, and the filter portions 32 correspond to the light-emitting regions 011 of the display substrate 10.

The reflective layer 30 formed by some embodiments of the present disclosure includes a plurality of filter portions 32 and the reflective portions 31 arranged between every two adjacent filter portions 32, and the reflective portions 31 correspond to the non-light-emitting region of the display substrate 10, and the filter portions 32 correspond to the light-emitting regions 011 of the display substrate 10. The reflective portions 31 are capable of reflecting the external ambient light, so that the display panel 1 can achieve the function of mirror display. The existence of the filter portions 32 may reduce the reflection of the external ambient light in the active area 01, increase the contrast of the display panel 1, and improve its display quality. Therefore, the display panel 1 manufactured in some embodiments of the present disclosure integrates the filter portions 32 and the reflective portions 31, which can improve the display quality on the premise of ensuring a mirror reflection effect.

In some embodiments, fabricating the reflective layer 30 on the side of the cathode 140 away from the light-emitting layers 131, includes S2011 to S2016.

In S2011, the first inorganic encapsulation layer 21 is fabricated on the cathode 140 through a patterning process; in some embodiments, the first inorganic encapsulation layer 21 being fabricated on the cathode 140 through the patterning process, includes:

depositing a layer of inorganic material film on the cathode 140; and fabricating a plurality of vias 24 penetrating the inorganic material film through a patterning process, so as to form the first inorganic encapsulation layer 21.

At least one reflective portion 31 fabricated in S2012 is electrically connected to the cathode 140 through the vias 24.

In S2012, the reflective portions 31 are fabricated on the first inorganic encapsulation layer 21 through a patterning process.

In some embodiments, as shown in FIG. 8, a plurality of reflective portions 31 being fabricated on the first inorganic encapsulation layer 21 through the patterning process, includes:

evaporating a layer of metal material film on the first inorganic encapsulation layer 21; and forming a plurality of hollowed-out regions 33 in regions of the metal material film corresponding to the light-emitting regions 011 of the display substrate 10 through a patterning process, and the plurality of reflective portions 31 being formed in a region of the metal material film corresponding to the non-light-emitting region 012 of the display substrate 10.

At least one reflective portion 31 is electrically connected to the cathode 140 through the vias 24 in the first inorganic encapsulation layer 21.

In S2013, the red filter portions 32R are fabricated on the first inorganic encapsulation layer 21 with the plurality of reflective portions 31 through a patterning process.

In S2014, the green filter portions 32G are fabricated on the first inorganic encapsulation layer 21 with the plurality of reflective portions 31 through a patterning process.

In S2015, the blue filter portions 32B are fabricated on the first inorganic encapsulation layer 21 with the plurality of reflective portions 31 through a patterning process.

In some embodiments, as shown in FIG. 9, in S2013 to S2015, fabricating the red filter portions 32R, the green filter portions 32G, and the blue filter portions 32B on the first inorganic encapsulation layer 21 with the plurality of reflective portions 31 through the patterning process, includes:

coating a red color film material on the base 11 on which the reflective portions 31 and the hollowed-out regions 33 are formed, and then exposing the red color film material using a mask, retaining the red color film material filled in hollowed-out regions 33 corresponding to the red filter portions 32R, and removing the remaining part of the red color film material, thereby forming the red filter portions 32R;

coating a green color film material on the base 11 on which the reflective portions 31 and the hollowed-out regions 33 are formed, and then exposing the green color film material using a mask, retaining the green color film material filled in hollowed-out regions 33 corresponding to the green filter portions 32G and removing the remaining part of the green color film material, thereby forming the green filter portions 32G; and coating a blue color film material on the base 11 on which the reflective portions 31 and the hollowed-out regions 33 are formed, and then exposing the blue color film material using a mask, retaining the blue color film material filled in a hollowed-out regions 33 corresponding to the blue filter portions 32B and removing the remaining part of the blue color film material, thereby forming the blue filter portions 32B.

In S2016, the organic encapsulation layer 22 is fabricated on the red filter portions 32R, the green filter portions 32G, and the blue filter portions 32B through a patterning process, and the second inorganic encapsulation layer 23 is fabricated on the organic encapsulation layer 22 through a patterning process.

It will be noted that, the order of S2013 to S2015 may be changed. For example, the green filter portions 32G may be fabricated first, then the red filter portions 32R may be fabricated, and the blue filter portions 323 may be fabricated finally; or, the blue filter portions 32B may be fabricated first, then the green filter portions 32G may be fabricated, and the red filter portions 32R may be fabricated finally.

The patterning process refers to a process of forming a film layer structure with a certain pattern. For example, the patterning process includes a photolithographic process and a printing (e.g., ink jet printing) process. The photolithographic process includes the following steps: coating photoresist on a film layer to be patterned (or directly patterning a photoresist film); exposing the coated photoresist; developing the exposed photoresist; etching an exposed portion of the film layer to be patterned after being developed (e.g., wet etching or dry etching); and removing the photoresist. It will be noted that, the film layer structure with a certain pattern formed through the patterning process may be continuous or discontinuous, and various parts of the film layer structure may be at different heights, and the various parts may have different thicknesses.

In some embodiments, fabricating the reflective layer 30 on the side of the cathode 140 away from the light-emitting layer 131 includes S2021 to S2025.

In S2021, the first inorganic encapsulation layer 21, the organic encapsulation layer 22, and the second inorganic encapsulation layer 23 are sequentially fabricated on the cathode 140 through a patterning process.

Fabricating the first inorganic encapsulation layer 21 on the cathode 140 through the patterning process, includes:
  depositing a layer of first inorganic material film on the cathode 140; and
  fabricating a plurality of first vias penetrating the first inorganic material film through a patterning process to form the first inorganic encapsulation layer 21.

Fabricating the organic encapsulation layer 22 on the first inorganic encapsulation layer 21 through the patterning process, includes:
  coating a layer of organic material film on the first inorganic encapsulation layer 21; and
  fabricating a plurality of second vias penetrating the organic material film through a patterning process, and positions of the second vias being in one-to-one correspondence with positions of the first vias, so as to form the organic encapsulation layer 22.

Fabricating the second inorganic encapsulation layer 23 on the organic encapsulation layer 22 through the patterning process, includes:
  depositing a layer of second inorganic material film on the organic encapsulation layer 22, wherein the second inorganic material and the first inorganic material may be the same or different; and
  fabricating a plurality of third vias penetrating the second inorganic material film through a patterning process, and positions of the third vias being in one-to-one correspondence with the positions of the second vies, so as to form the second inorganic encapsulation layer 23.

A first via, a second via and a third via together constitute the via 24, and the reflective portion 31 fabricated in S2022 is electrically connected to the cathode 140 through the via 24.

It will be noted that, when the organic encapsulation layer 22 is fabricated, the organic material may flow into the first vias, and when the second vies are fabricated, the organic material in the first vias may be removed through the patterning process. Similarly, when the second inorganic encapsulation layer 23 is fabricated, the second inorganic material may be deposited in the first vies and the second vias, and when the third vies are fabricated, the second inorganic material in the first vias and the second vies may be removed through the patterning process.

It will also be noted that, in some embodiments, the first inorganic material film, the organic material film, and the second inorganic material film may be fabricated first, and the vias 24 may be fabricated in the first inorganic material film, the organic material film, and the second inorganic material film at one time through one patterning process.

In S2022, the reflective portions 31 are fabricated on the second inorganic encapsulation layer 23 through a patterning process.

The process of fabricating the reflective portions 31 on the second inorganic encapsulation layer 23 is the same as or similar to the process of fabricating the reflective portions 31 on the first inorganic encapsulation layer 21.

In S2023, the red filter portions 32R are fabricated on the second inorganic encapsulation layer 23 through a patterning process.

In S2024, the green filter portions 32G are fabricated on the second inorganic encapsulation layer 23 through a patterning process.

In S2025, the blue filter portions 32B are fabricated on the second inorganic encapsulation layer 23 through a patterning process.

The processes of fabricating the red filter portions 32R, the green filter portions 32G, and the blue filter portions 32B in S2023 to S2025 are the same as or similar to the processes of fabricating the red filter portions 32R, the green filter portions 32G, and the blue filter portions 32B in S2013 to S2015.

It will be noted that, the order of S2023 to S2025 may be changed. For example, the green filter portions 32G may be fabricated first, and then the red filter portions 32R may be fabricated, and the blue filter portions 32B may be fabricated finally; or, the blue filter portions 32B may be fabricated first, and then the green filter portions 32G may be fabricated, and the red filter portions may be fabricated finally.

A method of manufacturing the display panel 1 will be described in detail below in conjunction with an example.

First, the pixel circuit 100, the anode 120, the light-emitting layer 131 and the cathode 140 are sequentially fabricated on a side of the base 11 to form the display substrate 10. For example, the display substrate 10 includes film layers such as the active layer AL, the gate insulating layer GI, the gate GT, the interlayer dielectric layer ILD, the source S and the drain D, the anode 120, the pixel define layer 14, and the method of fabricating these film layers will not be repeated here. The pixel define layer 14 is made of a black opaque material. In addition, the plurality of light-emitting layers 131 include the red light-emitting layers 131R, the green light-emitting layers 131G, and the blue light-emitting layers 131B, and the method of manufacturing the light-emitting layer 131 and the cathode 140 is not repeated here.

Next, a layer of inorganic material film (e.g., a silicon oxide or silicon nitride film) is deposited on the cathode 140 through a chemical vapor deposition method, and the vias 24 penetrating the inorganic material film are formed in a predetermined region through the patterning process to expose the cathode 140. A specific position of the via 24 may be referred to FIG. 3, and in this case, the formed inorganic material film is the first inorganic encapsulation layer 21.

Then, a layer of metal material film is evaporated on the first inorganic encapsulation layer 21, and a plurality of hollowed-out regions 33 are formed by hollowing out a region corresponding to the light-emitting region 011 of the display substrate 10 through the patterning process, and the reflective portion 31 is formed in a region corresponding to the non-light-emitting region 012 of the display substrate 10. As shown in FIG. 3, the reflective portion 31 is electrically connected to the cathode 140 through the via 24 formed in the previous step.

Next, color film layers are coated on the base 11 on which the reflective portion 31 and the hollowed-out region 33 are formed, and a plurality of filter portions 32 filled in the hollowed-out region 33 are formed through exposure. The plurality of filter portions 32 include the red filter portions 32R, the green filter portions 32G, and the blue filter portions 32B. As shown in FIG. 3, the thicknesses of the red filter portion 32R, the green filter portion 32G, and the blue filter portion 32B are greater than the thickness of the reflective portion 31, and the red filter portion 32R covers sides of the reflective portion 31 at a position adjacent to the red filter portion 32R and embeds vias 24 near the red filter portion 32R. The green filter portion 32G covers sides of the reflective portion 31 at a position adjacent to the green filter portion 32G and embeds the vias 24 near the green filter portion 32G. The blue filter portion 32B covers sides of the reflective portion 31 at a position adjacent to the blue filter portion 32B and embeds the vias 24 near the blue filter portion 32B.

Finally, the organic material film is coated on the base 11 on which the filter portion 32 is fabricated, and the organic encapsulation layer 22 is formed by exposure; and a layer of inorganic film layer is deposited on the organic encapsulation layer 22 through the chemical vapor deposition method to serve as the second inorganic encapsulation layer 23.

The foregoing descriptions are merely specific implementations of the present disclosure, but the protection scope of the present disclosure is not limited thereto. Any person skilled in the art could conceive of changes or replacements within the technical scope of the present disclosure, which shall be included in the protection scope of the present disclosure. Therefore, the protection scope of the present disclosure shall be subject to the protection scope of the claims.

What is claimed is:

1. A display panel, comprising:
 a display substrate having light-emitting regions and a non-light-emitting region, the display substrate including a base and a plurality of sub pixels located on the base, the plurality of sub pixels being defined by a plurality of gate lines and a plurality of data lines that are crisscrossed, each sub pixel including a light-emitting device and a pixel circuit electrically connected to the light-emitting device, and the light-emitting device including an anode, a light-emitting layer and a cathode that are stacked in sequence, the light-emitting regions including a region where the light-emitting device is located on the base, and the non-light-emitting region including a region where the pixel circuit is located on the base;
 a reflective layer located on a light exit side of the display substrate, the reflective layer including a plurality of filter portions and reflective portions arranged between every two adjacent filter portions, the reflective portions corresponding to the non-light-emitting region, and the filter portions corresponding to the light-emitting regions; and
 an encapsulation layer located on a side of the cathode away from the light-emitting layer, the encapsulation layer including a first inorganic encapsulation layer an organic encapsulation layer and a second inorganic encapsulation layer that are sequentially stacked in a thickness direction of the display substrate and away from the display substrate, and the first inorganic encapsulation layer, the organic encapsulation layer and the second inorganic encapsulation layer being each a one-piece entire layer,
 wherein an orthogonal projection of a reflective portion of the reflective portions on the display substrate partially overlaps with an orthogonal projection of a filter portion, adjacent to the reflective portion, of the plurality of filter portions on the display substrate, so that the filter portion covers edges of the reflective portion adjacent to the filter portion,
 wherein a thickness of the reflective portions is less than a thickness of the plurality of filter portions in a thickness direction of the display substrate;
 surfaces, proximate to the display substrate, of the plurality of filter portions are closer to the display substrate than surfaces, proximate to the display substrate, of the reflective portions; and
 surfaces, away from the display substrate, of the reflective portions are closer to the display substrate than surfaces, away from the display substrate, of the plurality of filter portions,
 wherein the encapsulation layer includes at least one via that is in one-to-one correspondence with at least one reflective portion;
 wherein the reflective layer is located between the first inorganic encapsulation layer and the organic encapsulation layer, a thickness of the first inorganic encapsulation layer is less than a thickness of the organic encapsulation laver, the at least one via penetrates the first inorganic encapsulation layer, and the at least one reflective portion is electrically connected to the cathode through a corresponding via; or
 wherein the reflective layer is located on a side of the second inorganic encapsulation layer away from the display substrate, the at least one via penetrates the first inorganic encapsulation laver, the organic encapsulation layer and the second inorganic encapsulation laver, and the at least one reflective portion is electrically connected to the cathode through a corresponding via.

2. The display panel according to claim 1, wherein the display substrate further includes a pixel define layer, and the pixel define layer includes opening regions and retaining walls arranged around the opening regions; and
 positions of the opening regions correspond to positions of the light-emitting regions, positions of the retaining walls correspond to a position of the non-light-emitting region, and a material of the retaining walls is a black opaque material.

3. The display panel according to claim 2, wherein the reflective portions are located on a side of the retaining walls away from the base, so that light emitted from one light-emitting region and directed to another adjacent light-emitting region is capable of being reflected by the reflective layer first and then being absorbed by the retaining walls.

4. The display panel according to claim 1, wherein a filter portion of the plurality of filter portions covers a via, adjacent to the filter portion of the plurality of filter portions, of the at least one via.

5. The display panel according to claim 1, wherein a plurality of light-emitting layers in the plurality of sub pixels include red light-emitting layers, green light-emitting layers, and blue light-emitting layers, and the plurality of filter portions include red filter portions, green filter portions, and blue filter portions;
   a position of a red filter portion corresponds to a position of a red light-emitting layer, and an area of an orthogonal projection of the red filter portion on the substrate is greater than an area of an orthogonal projection of the red light-emitting layer at a corresponding position on the substrate;
   a position of a green filter portion corresponds to a position of a green light-emitting layer, and an area of an orthogonal projection of the green filter portion on the substrate is greater than an area of an orthogonal projection of the green light-emitting layer at a corresponding position on the substrate; and
   a position of a blue filter portion corresponds to a position of a blue light-emitting layer, and an area of an orthogonal projection of the blue filter portion on the substrate is greater than an area of an orthogonal projection of the blue light-emitting layer at a corresponding position on the substrate.

6. The display panel according to claim 1, wherein a material of the reflective portions includes a metal material, and a material of the filter portions includes color photoresist.

7. The display panel according to claim 6, wherein the material of the reflective portions includes aluminum, silver, gold, or copper.

8. A display apparatus, comprising: the display panel according to claim 1.

9. A method of manufacturing a display panel, comprising:
   fabricating a pixel circuit, an anode, a light-emitting layer, and a cathode sequentially on a side of a base to form a display substrate, and the anode, the light-emitting layer and the cathode forming a light-emitting device, wherein the display substrate has light-emitting regions and a non-light-emitting region, a light-emitting region includes a region where the light-emitting device is located on the base, and the non-light-emitting region includes a region where the pixel circuit is located on the base; and
   fabricating a reflective layer on a side of the cathode away from the light-emitting layer, the reflective layer including a plurality of filter portions and reflective portions arranged between every two adjacent filter portions, the reflective portions corresponding to the non-light-emitting regions, and the filter portions corresponding to the light-emitting region,
   wherein an orthogonal projection of a reflective portion of the reflective portions on the display substrate partially overlaps with an orthogonal projection of a filter portion, adjacent to the reflective portion, of the plurality of filter portions on the display substrate, so that the filter portion covers edges of the reflective portion adjacent to the filter portion; and
   a thickness of the reflective portions is less than a thickness of the plurality of filter portions in a thickness direction of the display substrate;
   surfaces, proximate to the display substrate, of the plurality of filter portions are closer to the display substrate than surfaces, proximate to the display substrate, of the reflective portions; and
   surfaces, away from the display substrate, of the reflective portions are closer to the display substrate than surfaces, away from the display substrate, of the plurality of filter portions,
   wherein fabricating the reflective layer on the side of the cathode away from the light-emitting layer includes:
      fabricating a first inorganic encapsulation layer on the cathode through a patterning process, the first inorganic encapsulation layer being a one-piece entire layer, and the first inorganic encapsulation layer including at least one via;
      fabricating a plurality of reflective portions on the first inorganic encapsulation layer through a patterning process, and at least one reflective portion being electrically connected to the cathode through a corresponding via; and
      fabricating the plurality of filter portions on the first inorganic encapsulation layer with the plurality of reflective portions through a patterning process; and
   after fabricating the reflective layer on the side of the cathode away from the light-emitting laver, the manufacturing method further includes:
   fabricating an organic encapsulation layer on the reflective layer, a thickness of the first inorganic encapsulation layer being less than a thickness of the organic encapsulation layer; and
   fabricating a second inorganic encapsulation layer on the organic encapsulation layer;
   or
   wherein fabricating the reflective layer on the side of the cathode away from the light-emitting layer includes:
      fabricating an encapsulation layer on the cathode through a patterning process the encapsulation layer including the first inorganic encapsulation layer, an organic encapsulation layer, and a second inorganic encapsulation layer that are sequentially fabricated on the cathode, the first inorganic encapsulation layer, the organic encapsulation layer and the second inorganic encapsulation layer being each a one-piece entire layer, and the encapsulation layer including at least one via;
      fabricating a plurality of reflective portions on the encapsulation layer through a patterning process, and at least one reflective portion being electrically connected to the cathode through a corresponding via; and
      fabricating the plurality of filter portions on the encapsulation layer with the plurality of reflective portions through a patterning process.

10. The manufacturing method according to claim 9, wherein in a case where the first inorganic encapsulation layer includes the at least one via, fabricating the first inorganic encapsulation layer on the cathode through the patterning process includes: depositing a layer of inorganic material film on the cathode; and
   fabricating at least one via penetrating the inorganic material film through a patterning process, and the at least one reflective portion being electrically connected to the cathode through a corresponding via.

11. The manufacturing method according to claim 9, wherein in a case where the first inorganic encapsulation layer includes the at least one via, fabricating the plurality of reflective portions on the first inorganic encapsulation layer through the patterning process includes:
- evaporating a layer of metal material film on the first inorganic encapsulation layer; and
- forming a plurality of hollowed-out regions in regions of the metal material film corresponding to the light-emitting regions through a patterning process, positions of the plurality of hollowed-out regions corresponding to positions of the plurality of filter portions, and regions of the metal material film corresponding to the non-light-emitting region forming the plurality of reflective portions.

12. The manufacturing method according to claim 9, wherein in a case where the encapsulation layer includes the at least one via, fabricating the encapsulation layer on the cathode through the patterning process includes one of the following:
- depositing a layer of first inorganic material film on the cathode;
- fabricating at least one first via penetrating the first inorganic material film through a patterning process to form a first inorganic encapsulation layer;
- coating a layer of organic material film on the first inorganic encapsulation layer;
- fabricating at least one second via penetrating the organic material film through a patterning process to form an organic encapsulation layer, and a position of the at least one second via being in one-to-one correspondence with a position of the at least one first via;
- depositing a layer of second inorganic material film on the organic encapsulation layer;
- fabricating at least one third via penetrating the second inorganic material film through a patterning process to form a second inorganic encapsulation layer, and a position of the at least one third via being in one-to-one correspondence with the position of the at least one second via;
- a first via, a corresponding second via and a corresponding third via together form a via; or
- depositing a layer of first inorganic material film on the cathode;
- coating a layer of organic material film on the first inorganic material film;
- depositing a layer of second inorganic material film on the organic material film; and
- fabricating at least one via penetrating the first inorganic material film, and the organic material film and the second inorganic material film through a patterning process.

* * * * *